United States Patent
Itagaki

(10) Patent No.: US 8,312,408 B2
(45) Date of Patent: *Nov. 13, 2012

(54) METHOD AND DESIGN SYSTEM FOR SEMICONDUCTOR INTEGRATED CIRCUIT

(75) Inventor: Daishin Itagaki, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 129 days.

This patent is subject to a terminal disclaimer.

(21) Appl. No.: 12/801,123

(22) Filed: May 24, 2010

(65) Prior Publication Data

US 2010/0306727 A1 Dec. 2, 2010

(30) Foreign Application Priority Data

May 28, 2009 (JP) .................................. 2009-128619

(51) Int. Cl.
*G06F 17/50* (2006.01)

(52) U.S. Cl. ........ 716/124; 716/111; 716/122; 716/123; 716/125; 716/129; 716/130; 716/131

(58) Field of Classification Search .................. 716/111, 716/122, 123, 124, 125, 129, 130, 131
See application file for complete search history.

(56) References Cited

U.S. PATENT DOCUMENTS

| | | | | |
|---|---|---|---|---|
| 5,225,991 A * | 7/1993 | Dougherty | ..................... | 716/123 |
| 5,459,093 A * | 10/1995 | Kuroda et al. | ................ | 438/599 |
| 5,654,897 A * | 8/1997 | Tripathi et al. | ............... | 438/599 |
| 5,946,477 A * | 8/1999 | Ito | ................................ | 716/123 |
| 6,865,727 B2 * | 3/2005 | Frerichs et al. | ................. | 716/55 |
| 7,007,259 B2 * | 2/2006 | Shrowty et al. | ............... | 716/113 |
| 7,013,446 B2 | 3/2006 | Ohba et al. | | |
| 7,203,914 B2 * | 4/2007 | Wood | ............................. | 716/113 |
| 7,272,810 B2 * | 9/2007 | Orita | ................................ | 326/80 |
| 7,332,380 B2 | 2/2008 | Matsuda | | |
| 7,539,952 B2 * | 5/2009 | Watanabe et al. | ............. | 716/119 |
| 7,805,697 B2 * | 9/2010 | Wood | ............................. | 716/113 |
| 7,861,190 B1 * | 12/2010 | Kretchmer et al. | ........... | 716/102 |
| 7,877,709 B2 * | 1/2011 | Itagaki | ......................... | 716/100 |
| 7,900,177 B2 * | 3/2011 | Hirabayashi | .................. | 716/122 |
| 7,908,578 B2 * | 3/2011 | Becker et al. | ................. | 716/122 |
| 7,926,006 B2 * | 4/2011 | Bailey et al. | .................... | 716/54 |
| 7,977,233 B2 * | 7/2011 | Mori et al. | ..................... | 438/622 |
| 7,996,813 B2 * | 8/2011 | Hatano et al. | ................. | 716/139 |

(Continued)

FOREIGN PATENT DOCUMENTS

JP 2004-39951 A 2/2004

(Continued)

*Primary Examiner* — Phallaka Kik
(74) *Attorney, Agent, or Firm* — McGinn IP Law Group, PLLC

(57) ABSTRACT

A layout region in which a wiring pattern and a special pattern are placed is divided into division regions. The minimum pitch for the special pattern is larger than the minimum pitch for the wiring pattern. With respect to each division region, the special pattern included in a predetermined region surrounding the each division region is extracted as a peripheral pattern, and a dummy pattern placement region included in the each division region is determined. The dummy pattern placement region is apart from at least one of boundaries between adjacent division regions. A dummy pattern is added in the dummy pattern placement region with avoiding a design rule error with the peripheral pattern existing around the each division region. Then, the plurality of division regions to which the dummy pattern is added are coupled with each other.

20 Claims, 8 Drawing Sheets

U.S. PATENT DOCUMENTS

| | | | |
|---|---|---|---|
| 8,024,689 B2 * | 9/2011 | Shinomiya et al. | 716/126 |
| 8,028,264 B2 * | 9/2011 | Shimada et al. | 716/122 |
| 8,032,856 B2 * | 10/2011 | Itagaki | 716/139 |
| 8,104,008 B2 * | 1/2012 | Fukuda | 716/110 |
| 8,136,070 B2 * | 3/2012 | Doong et al. | 716/118 |
| 2002/0144224 A1 * | 10/2002 | Frerichs et al. | 716/4 |
| 2004/0083438 A1 | 4/2004 | Ohba et al. | |
| 2005/0028121 A1 * | 2/2005 | Shrowty et al. | 716/10 |
| 2005/0097490 A1 * | 5/2005 | Travis et al. | 716/10 |
| 2005/0251775 A1 * | 11/2005 | Wood | 716/10 |
| 2006/0094190 A1 | 5/2006 | Matsuda | |
| 2006/0168551 A1 * | 7/2006 | Mukuno | 716/5 |
| 2007/0011638 A1 * | 1/2007 | Watanabe et al. | 716/10 |
| 2007/0050748 A1 * | 3/2007 | Juengling | 716/19 |
| 2007/0061768 A1 * | 3/2007 | Travis et al. | 716/10 |
| 2008/0179754 A1 * | 7/2008 | Hirabayashi | 257/773 |
| 2008/0203562 A1 * | 8/2008 | Araki et al. | 257/734 |
| 2009/0013295 A1 * | 1/2009 | Ji | 716/10 |
| 2009/0055792 A1 | 2/2009 | Itagaki | |
| 2009/0155990 A1 * | 6/2009 | Yanagidaira et al. | 438/584 |
| 2010/0115479 A1 * | 5/2010 | Hatano et al. | 716/4 |
| 2010/0193960 A1 * | 8/2010 | Mashita et al. | 257/773 |
| 2010/0325592 A1 * | 12/2010 | Ji | 716/55 |
| 2011/0239170 A1 * | 9/2011 | Mori et al. | 716/55 |

FOREIGN PATENT DOCUMENTS

| | | |
|---|---|---|
| JP | 2006-60051 A | 3/2006 |
| JP | 2009-49341 A | 3/2009 |

* cited by examiner

METHOD AND DESIGN SYSTEM FOR SEMICONDUCTOR INTEGRATED CIRCUIT

INCORPORATION BY REFERENCE

This application is based upon and claims the benefit of priority from Japanese patent application No. 2009-128619, filed on May 28, 2009, the disclosure of which is incorporated herein in its entirety by reference.

BACKGROUND OF THE INVENTION

1. Field of the Invention

The present invention relates to a design technique for a semiconductor integrated circuit. More particularly, the present invention relates to a design technique for a semiconductor integrated circuit provided with a dummy pattern.

2. Description of Related Art

In a semiconductor integrated circuit, there may be dense and sparse wiring pattern regions in terms of design. That is, the regions where a density of a wiring pattern (hereinafter referred to as a "pattern density") is high and low may exist. Such nonuniformity in the pattern density may cause various problems in a manufacturing process of a design circuit.

For example, in a CMP (Chemical Mechanical Polishing) process, there occurs a difference in polishing characteristics between the high and low pattern density regions. As a result, there occurs a phenomenon called "dishing" in which a surface of a wiring (e.g., Cu wiring) dishes. The dishing means reductions in flatness of the wiring and a film thickness, which causes variation and increase in a wiring resistance.

To suppress such a defect occurring during the manufacturing process, it is important to, in a circuit design phase, equalize the pattern density as much as possible. For this purpose, in addition to a circuit wiring pattern (signal wirings, power supply lines, ground lines and the like), a "dummy pattern" is generally added to a design layout (refer to Japanese Patent Publication JP-2004-39951A and Japanese Patent Publication JP-2006-60051A). The dummy pattern is a wiring pattern unnecessary for any function of the design circuit, and also referred to as a dummy wiring or dummy metal. By adding the dummy pattern, the pattern density can be more equalized to thereby suppress the dishing or the like from occurring.

Japanese Patent Publication JP-2004-39951A describes a technique for improving local uniformity of a wiring pattern. For this purpose, a layout region is divided into a plurality of division regions, and a dummy pattern is inserted between design patterns of the division regions.

Japanese Patent Publication JP-2006-60051A describes a method of forming a dummy pattern having a highly uniform coverage. According to the method, a dummy pattern formation region is divided into a plurality of dummy pattern formation unit regions. Then, a plurality of inspection regions each having an area larger than the dummy pattern formation region are set. The plurality of inspection regions partially overlap with each other. Subsequently, a tentative coverage of a dummy pattern formed in the dummy pattern formation unit region in the inspection region is calculated. The calculated tentative pattern coverages are averaged to determine a final pattern coverage. A dummy pattern having an area corresponding to the final pattern coverage is formed in the dummy pattern formation unit region.

As described above, to improve a yield of a semiconductor integrated circuit, it is important to preliminarily place the dummy pattern in the design phase. However, a time required for the dummy pattern placement processing increases as the design circuit is increased in size, which causes an increase in design TAT (Turn Around Time). For this reason, it is considered that the layout region is divided into a plurality of division regions. By executing the dummy pattern placement processing in parallel with respect to the plurality of division regions, the design TAT is supposed to be reduced.

Here, the inventor of the present application has recognized the following points. That is, if the layout region is divided without discretion and the dummy pattern placement processing is performed with respect to the plurality of division regions independently of each other, the following problem may be caused.

For example, a dummy pattern placed in a division region may be too close to a wiring pattern in the adjacent division region. That is, a design rule error (spacing error) may occur between patterns in division regions adjacent to each other. This is because the dummy pattern placement processing is performed for the respective division regions independently of each other.

Moreover, in order to stabilize an electrical characteristic of a dummy pattern to reduce noise, it is desirable that the dummy pattern placed is connected to a power supply line or ground line. Here, let us consider a case where a first dummy pattern is placed in a division region; a second dummy pattern is placed in the adjacent division region; and the first dummy pattern and the second dummy pattern are respectively connected to a power supply line and a ground line. However, at a boundary between the division regions, the first dummy pattern and the second dummy pattern may come into contact with or overlap with each other. In such a case, a short circuit occurs between the first dummy pattern and the second dummy pattern.

For such a problem, the inventor of the present application has proposed a method of designing a semiconductor integrated circuit which is disclosed in Japanese Patent Publication JP-2009-49341A. The design method includes: (a) dividing a layout region in which a wiring pattern is placed into a plurality of division regions; (b) determining, with respect to each of the plurality of division regions, a dummy pattern placement region included in the each division region; (c) adding a dummy pattern in the dummy pattern placement region of the each division region; and (d) coupling the plurality of division regions to which dummy patterns are added with each other. Here, the dummy pattern placement region is apart from at least one of boundaries between the each division region and adjacent division regions.

According to an embodiment described in Japanese Patent Publication JP-2009-49341A, when the dummy pattern placement region is determined, "division boundary shift processing" and "setback processing" are performed. First, it is checked whether or not a division boundary parallel to wiring tracks overlaps with some wiring track. If some division boundary overlaps with (correspond to) any of the wiring tracks, the division boundary is parallel translated to a location where the division boundary does not overlap with the wiring track. This is the "division boundary shift processing". On the other hand, in the setback processing, with respect to each division region, a region having a size corresponding to the division region is reduced by a predetermined distance from a division boundary intersecting with a wiring track towards inside. The resultant region is set as the dummy pattern placement region. That is, the dummy pattern placement region is apart from the division boundary intersecting with the wiring track by the predetermined distance. The predetermined distance is, for example, a minimum wiring pitch (hereinafter referred to as a "first wiring pitch") specified by a design rule.

As described above, according to Japanese Patent Publication JP-2009-49341A, the layout region is divided into the plurality of division regions. Accordingly, the dummy pattern placement processing can be performed "in parallel". Moreover, the dummy pattern placement region in which the dummy pattern is placed is determined through the above-described "division boundary shift processing" and "setback processing". As a result, after the division regions are coupled with each other, a design rule error or short circuit around the division boundary is prevented from occurring. That is, the design TAT can be reduced with suppressing the occurrence of the design rule error or short circuit.

The inventor of the present application has recognized the following points. According to Japanese Patent Publication JP-2009-49341A, the dummy pattern placement processing can be performed with respect to a plurality of division regions in a parallel distributed manner, and thereby a time required for the dummy pattern placing can be considerably shortened. That is, the design TAT is considerably reduced.

However, only in some special situations, a design rule error around a division boundary may occur. That is a case where a macro cell pattern or a thick wiring pattern is placed near an outside of a division boundary of some division region. A wiring pitch specified by the design rule for the macro cell pattern or the thick wiring pattern is hereinafter referred to as a "second wiring pitch". In general, regarding the macro cell or the thick wiring, the second wiring pitch is set larger than the above-described first wiring pitch for a normal wiring pattern, in order to improve yield. In other words, it is necessary to ensure a larger wiring pitch than normal for the macro cell pattern or the thick wiring pattern. Therefore, even if a dummy pattern placement region is set back from a division boundary intersecting with a wiring track by the "first wiring pitch", a design rule error may occur after the coupling of the division regions in the case where a macro cell pattern or a thick wiring pattern is placed near an outside of the division boundary.

SUMMARY

In one embodiment of the present invention, a method of designing a semiconductor integrated circuit is provided. The method includes: (A) dividing a layout region in which a wiring pattern and a special pattern are placed into a plurality of division regions, wherein a minimum pitch specified for the wiring pattern by a design rule is a first wiring pitch and a minimum pitch specified for the special pattern by the design rule is a second wiring pitch larger than the first wiring pitch; (B) extracting, with respect to each of the plurality of division regions, the special pattern included in a region that surrounds the each division region and has a predetermined width, wherein the extracted special pattern is a peripheral pattern; (C) determining, with respect to the each division region, a dummy pattern placement region included in the each division region, wherein the dummy pattern placement region is apart from at least one of boundaries between the each division region and adjacent division regions; (D) adding a dummy pattern in the dummy pattern placement region of the each division region, with avoiding a design rule error with the peripheral pattern existing around the each division region; and (E) coupling the plurality of division regions to which the dummy pattern is added with each other.

In another embodiment of the present invention, a design system for a semiconductor integrated circuit is provided. The design system has: a storage device in which a layout data indicating a wiring pattern and a special pattern is stored; a first computer; and a plurality of second computers. A minimum pitch specified for the wiring pattern by a design rule is a first wiring pitch, and a minimum pitch specified for the special pattern by the design rule is a second wiring pitch larger than the first wiring pitch. The first computer reads the layout data from the storage device and divides a layout region in which the wiring pattern and the special pattern are placed into a plurality of division regions. With respect to each of the plurality of division regions, the first computer extracts the special pattern included in a region that surrounds the each division region and has a predetermined width, the extracted special pattern being a peripheral pattern. With respect to the each division region, the first computer determines a dummy pattern placement region included in the each division region. The dummy pattern placement region is apart from at least one of boundaries between the each division region and adjacent division regions. With respect to the each division region, the first computer generates a division region data indicating layout of the each division region, the dummy pattern placement region and the peripheral pattern. The plurality of second computers execute dummy pattern placement processing with respect to the plurality of division regions in a distributed manner. In the dummy pattern placement processing, each of the plurality of second computers receives the division region data of the corresponding division region and adds a dummy pattern in the dummy pattern placement region with avoiding a design rule error with the peripheral pattern. The first computer receives the plurality of division region data to which the dummy pattern is added and couples the plurality of division regions with each other.

According to the present invention, the design TAT can be reduced with suppressing occurrence of a design rule error or short circuit. Moreover, even if a special pattern to which a design rule of the second wiring pitch is applied is present near an outside of a division boundary, a design rule error around the division boundary can be prevented from occurring after the coupling of the division regions.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

1. Design Method

Figure 1:
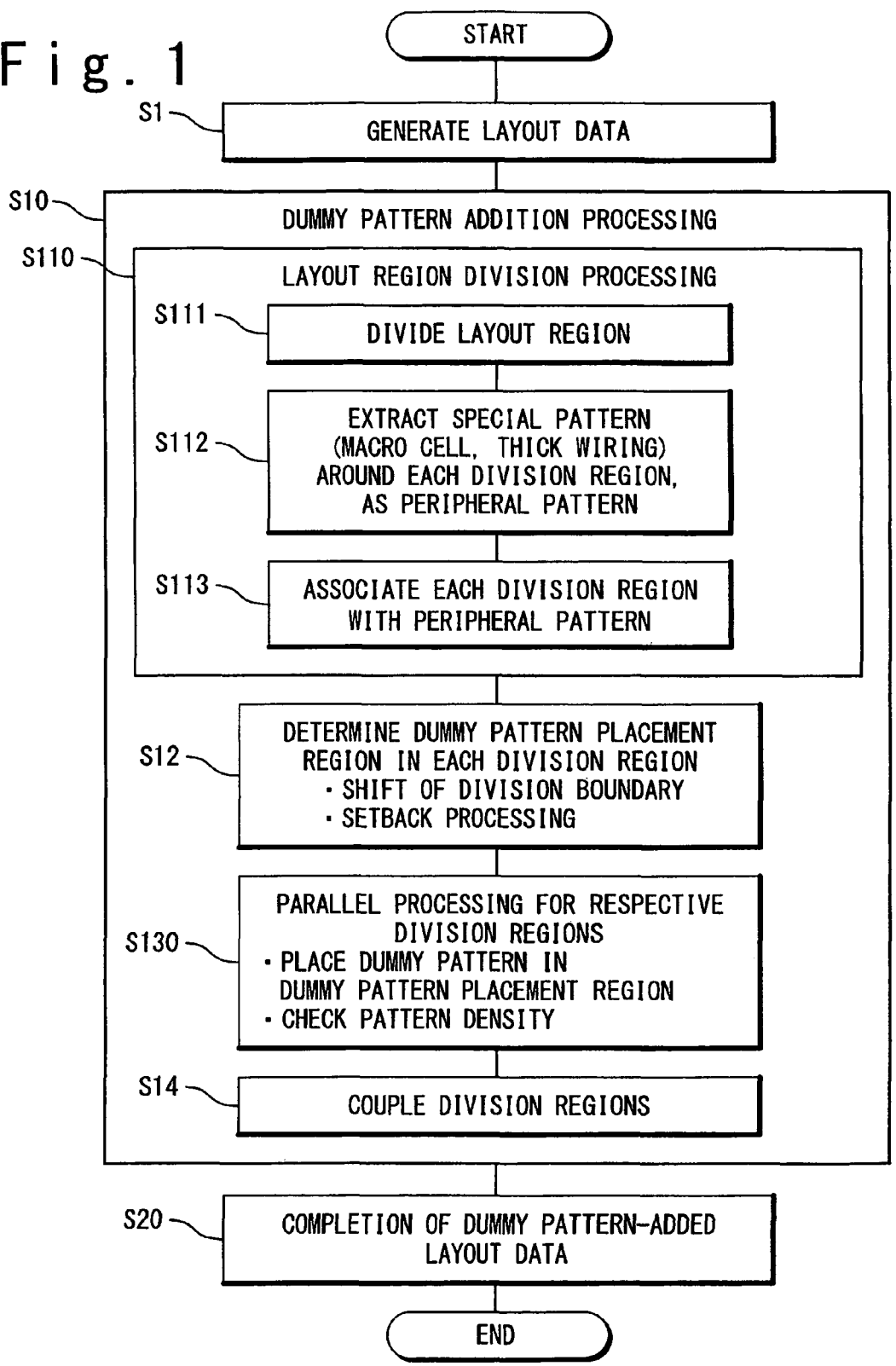
FIG. 1 is a flowchart showing a design method for a semiconductor integrated circuit according to an embodiment of the present invention.
Figure 8:
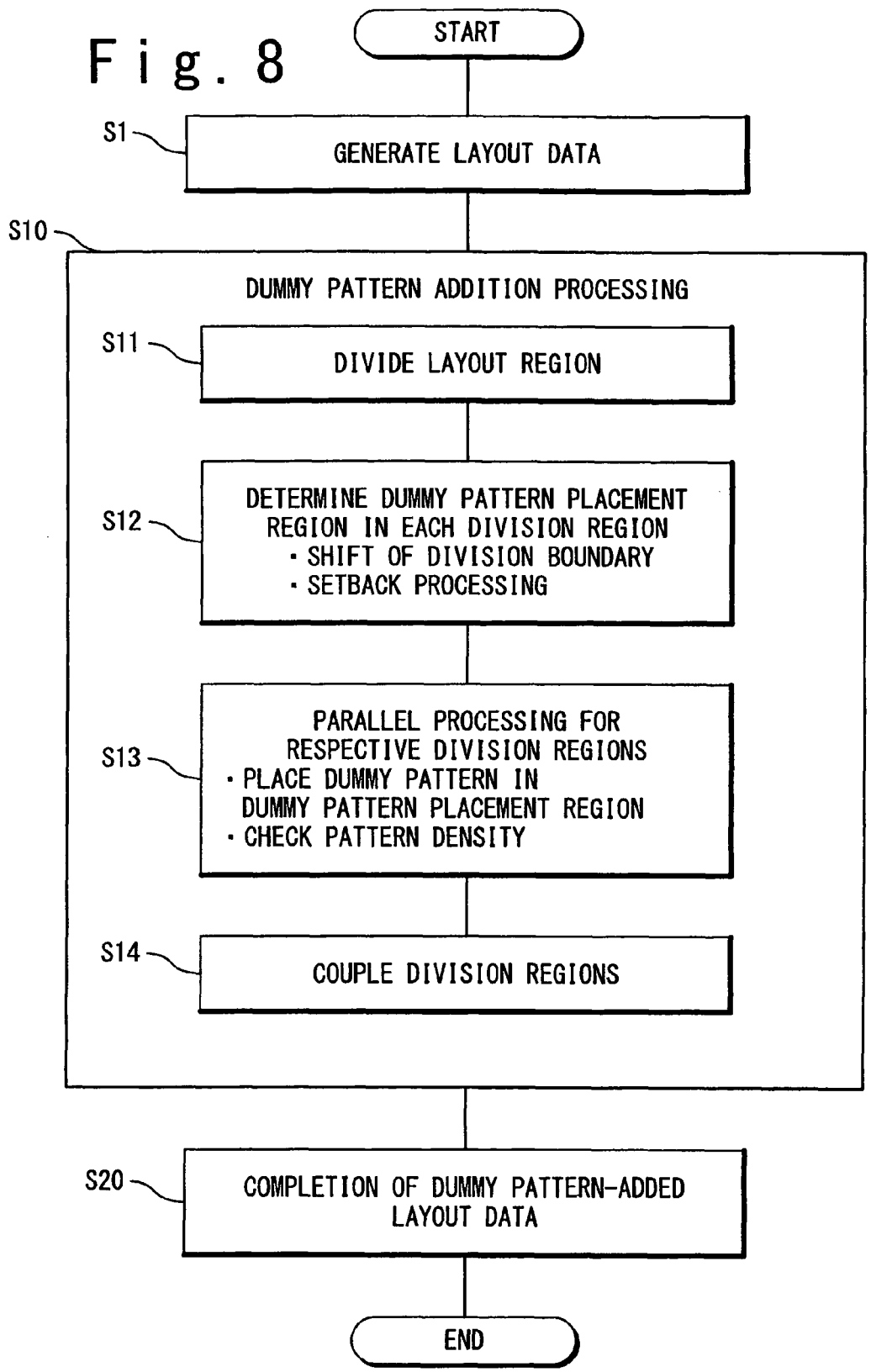
FIG. 8 is a flowchart showing a design method for a semiconductor integrated circuit according to an embodiment disclosed in Japanese Patent Publication JP-2009-49341A.

FIG. 1 is a flowchart showing a design method for a semiconductor integrated circuit according to an embodiment of the present invention. FIG. 8 is a flowchart showing a design method for a semiconductor integrated circuit according to an embodiment disclosed in Japanese Patent Publication JP-2009-49341A. An overlapping description with Japanese Patent Publication JP-2009-49341A will be omitted as appropriate.

Step S1:

First, a layout data of a design circuit is generated according to a well-known method. The layout data indicates layout of the design circuit, i.e., layout including various types of cells, inter-cell wirings, power supply lines, ground lines and the like. It will be appreciated that the layout data at this time is one before addition of a dummy pattern.

Figure 2:
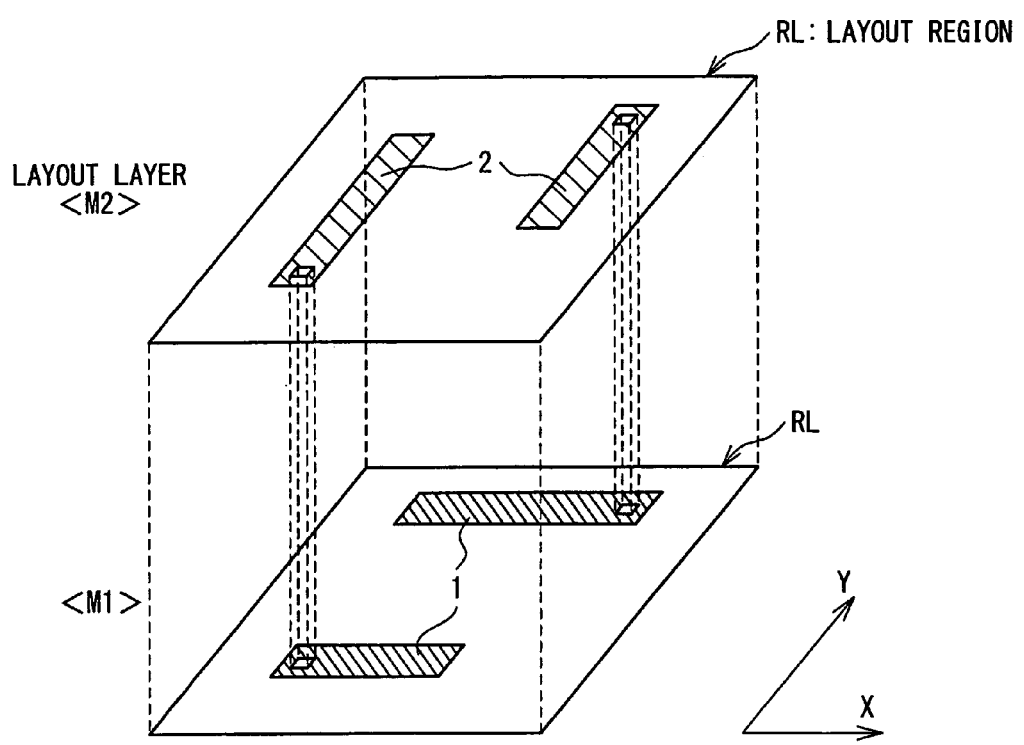
FIG. 2 conceptually shows a layout data of a semiconductor integrated circuit.

FIG. 2 conceptually shows the layout data of some semiconductor integrated circuit (semiconductor chip). The layout data includes a plurality of layout layers. Each of the layout layers has a layout region RL in which a wiring pattern and the like (including a special pattern to be described below) are placed. For example, FIG. 2 illustrates two different layout layers M1 and M2 respectively corresponding to two different wiring layers. In the layout region RL of the layout layer M1, wiring patterns 1 along an X-direction are placed. On the other hand, in the layout region RL of the layout layer M2, wiring patterns 2 along a Y-direction are placed. The X-direction and the Y-direction intersect with each other, and are typically orthogonal to each other. The wiring pattern 1 along the X-direction in the layout layer M1 and the wiring pattern 2 along the Y-direction in the layout layer M2 are connected to each other through a via. It should be noted that the wiring patterns 1 and 2 are patterns of wirings such as signal wirings necessary for an operation of the design circuit.

Step S10:

After the layout data of the design circuit is generated, a "dummy pattern (dummy metal)" is added to the design layout. That is, the dummy pattern is added to the layout data generated in Step S1. The dummy pattern is a wiring pattern unnecessary for the operation and function of the design circuit, and a pattern different from the existing wiring patterns. By adding the dummy pattern, the pattern density can be more equalized to thereby suppress occurrence of the dishing and the like. The processing in Step S10 will be described below in detail.

According to the present embodiment, Step S110 is executed instead of Step S11 in Japanese Patent Publication JP-2009-49341A.

Step S110:

A time required for the dummy pattern placement processing increases as the design circuit is increased in size, which leads to an increase in the design TAT. For this reason, the dummy pattern placement processing is carried out in a parallel distributed manner. For this purpose, in Step S110, the layout region RL of each layout layer is divided (sectioned) into a plurality of division regions. More specifically, Step S110 includes the following Steps S111 to S113.

Step S111:

This step is the same as Step S11 disclosed in Japanese Patent Publication JP-2009-49341A. That is, the layout region RL of each layout layer is divided (sectioned) into a plurality of division regions RD.

Figure 3:
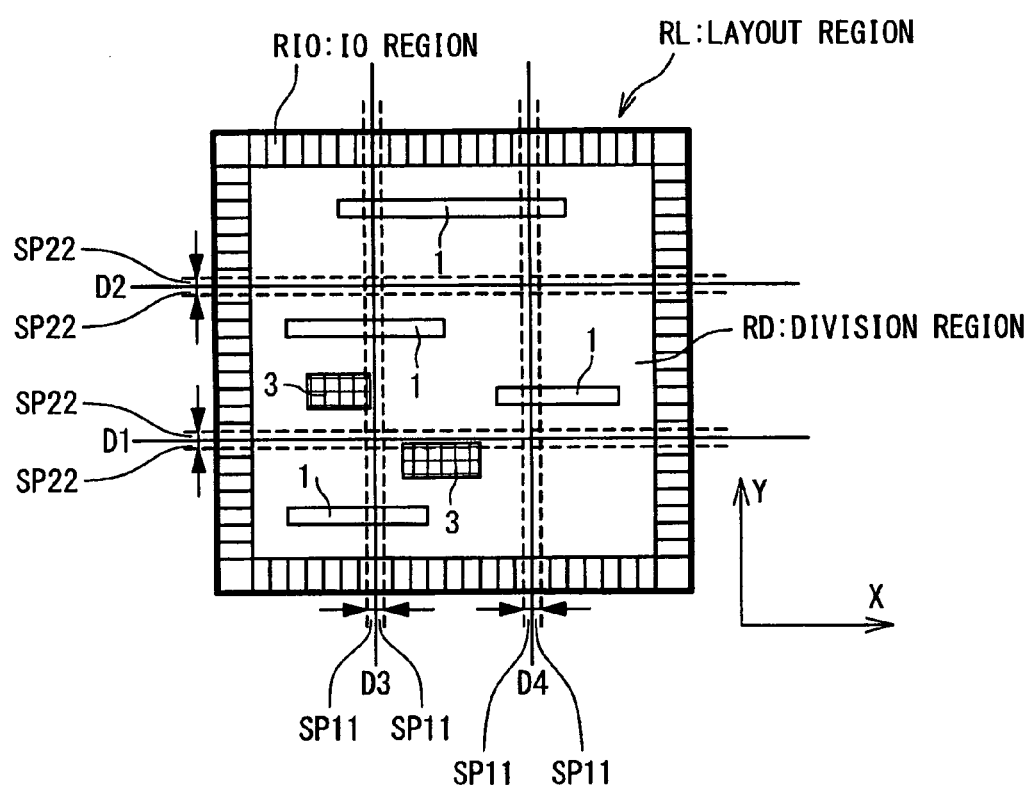
FIG. 3 is a conceptual diagram for explaining layout region division processing (Step S110)

FIG. 3 shows an example of the division of the layout region RL. As the example, the layout region RL of the layout layer M1 is illustrated. An IO region RIO in which IO cells are placed is present along a circumferential edge of the layout region RL, and the wiring patterns and the like are placed in a region surrounded by the IO region RIO. In the layout layer M1, wiring tracks serving as wiring reference lines are along the X-direction, and the wiring patterns and the like are placed on the wiring tracks along the X-direction.

For example, as shown in FIG. 3, the wiring patterns 1 and special patterns 3 are placed along the X-direction. Here, the "special pattern 3" is a pattern whose minimum pitch (minimum interval to be satisfied by the layout pattern) specified (defined) by a design rule is larger than that of the normal wiring pattern 1. That is, when the minimum pitch for the wiring pattern 1 specified by the design rule is a "first wiring pitch", the minimum pitch for the special pattern 3 specified by the design rule is a "second wiring pitch" that is larger than the first wiring pitch.

Such a special pattern 3 is exemplified by a macro cell pattern, a thick wiring pattern whose width is thicker than that of the wiring pattern 1, and the like. A special thick wiring pattern whose width is thicker than that of the wiring pattern 1 is also used within a macro cell. In the following description, the special pattern 3 may be referred to as a "thick wiring pattern 3". Typically, the first wiring pitch is the minimum among wiring pitches specified (defined) in the design rule, and the second wiring pitch is the maximum among the wiring pitches specified (defined) in the design rule.

As shown in FIG. 3, in this Step S111, the layout region RL is divided into the plurality of division regions RD by division lines D1 to D4. The existing wiring patterns 1 and thick wiring patterns 3 may be divided by the division lines. A boundary between some division region RD and a division region adjacent to the some division region RD corresponds to any of the division lines D1 to D4. That is, a boundary between adjacent division regions RD corresponds to any of the division lines D1 to D4. In that sense, the division lines D1 to D4 are hereinafter referred to as "division boundaries". The division boundaries D1 and D2 are along the X-direction and parallel to the wiring tracks. On the other hand, the division boundaries D3 and D4 are along the Y-direction and intersect with (orthogonal to) the wiring tracks. The same processing is applied to the other layout layers. Note that a size and shape of each division region RD are arbitrary.

Step S112:

Next, the thick wiring patterns 3 existing around respective division regions RD are checked. More specifically, with respect to each division region RD, it is checked whether or not the thick wiring pattern 3 exists in a region that surrounds the division region RD and has a predetermined width (SP11, SP22). As shown in FIG. 3, the predetermined width along the X-direction is SP11, and the predetermined width along the Y-direction is SP22. The predetermined widths (SP11 and SP22) are, for example, equal to the above-described second wiring pitch specified by the design rule.

Figure 4:
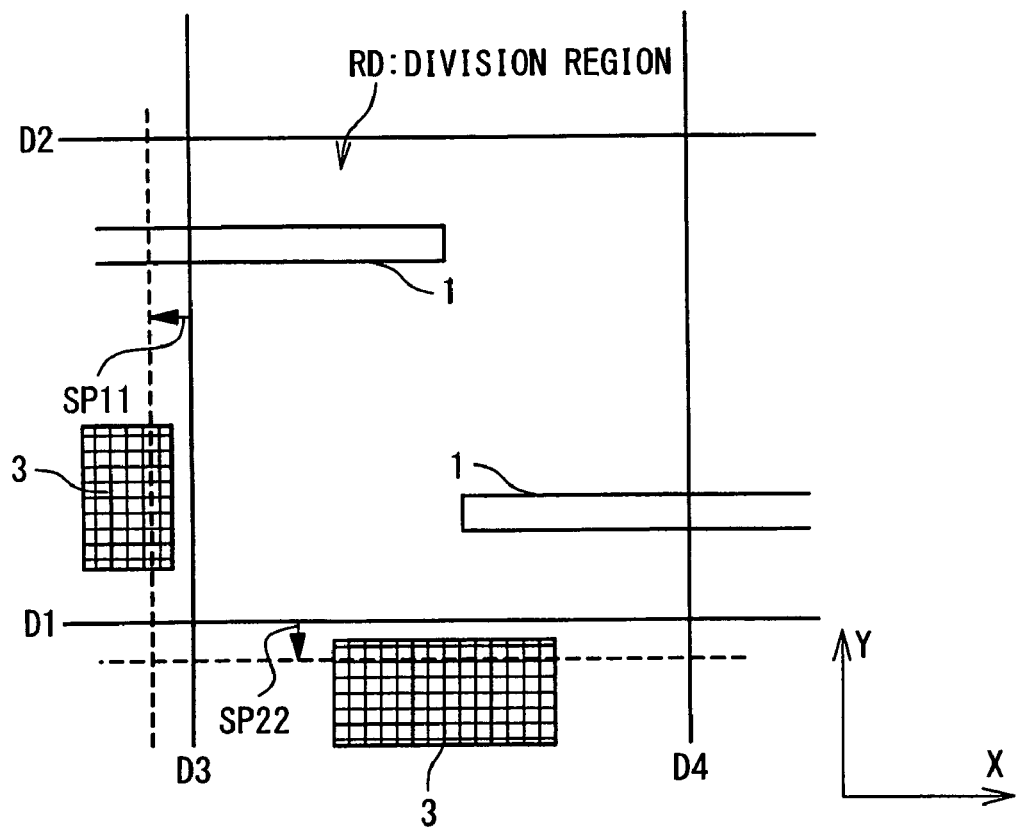
FIG. 4 is a conceptual diagram for explaining a division region data including a thick wiring pattern.

FIG. 4 illustrates some division region RD and the thick wiring patterns 3 placed around the division region RD. Boundaries between the division region RD and the adjacent division regions include the division boundaries D1 to D4. As shown in FIG. 4, a thick wiring pattern 3 exists within a region having the width SP22 outward from the division boundary D1. Also, a thick wiring pattern 3 exists within a region having the width SP11 outward from the division boundary D3. That is, the thick wiring pattern 3 is present in the predetermined-width-region surrounding the division region RD. In this case, such the thick wiring pattern 3 is extracted as a "peripheral pattern".

Step S113:

When the peripheral pattern is extracted with regard to some division region RD, the extracted peripheral pattern is associated with the division region RD. Here, a state where the some division region RD and the peripheral pattern are associated with each other means a state where, when the division region RD is referred to, the peripheral pattern existing around the division region RD also is simultaneously recognizable. For example, the extracted peripheral pattern is added to the layout data of the division region RD. Alternatively, the layout data of the division region RD and a peripheral pattern data indicating layout of the extracted peripheral pattern are associated with each other. In either case, a relative positional relationship between the division region RD and the peripheral pattern around the division region RD is maintained. For example, in FIG. 4, a relative positional relationship (interval and distance) between the division boundary D1 and the peripheral pattern (thick wiring pattern 3) near the division boundary D1 is maintained, while the peripheral pattern and the division region RD are associated with each other.

Step S12:

This step is the same as Step S12 disclosed in Japanese Patent Publication JP-2009-49341A. That is, with respect to each of the plurality of division regions RD, the "setback processing" and the "division boundary shift processing" are performed. As a result, the "dummy pattern placement region RP" in which the dummy pattern is allowed to be placed is determined with respect to each division region RD. The dummy pattern placement region RP is a region included in the corresponding division region RD, and has the same features as that disclosed in Japanese Patent Publication JP-2009-49341A.

Figure 5:
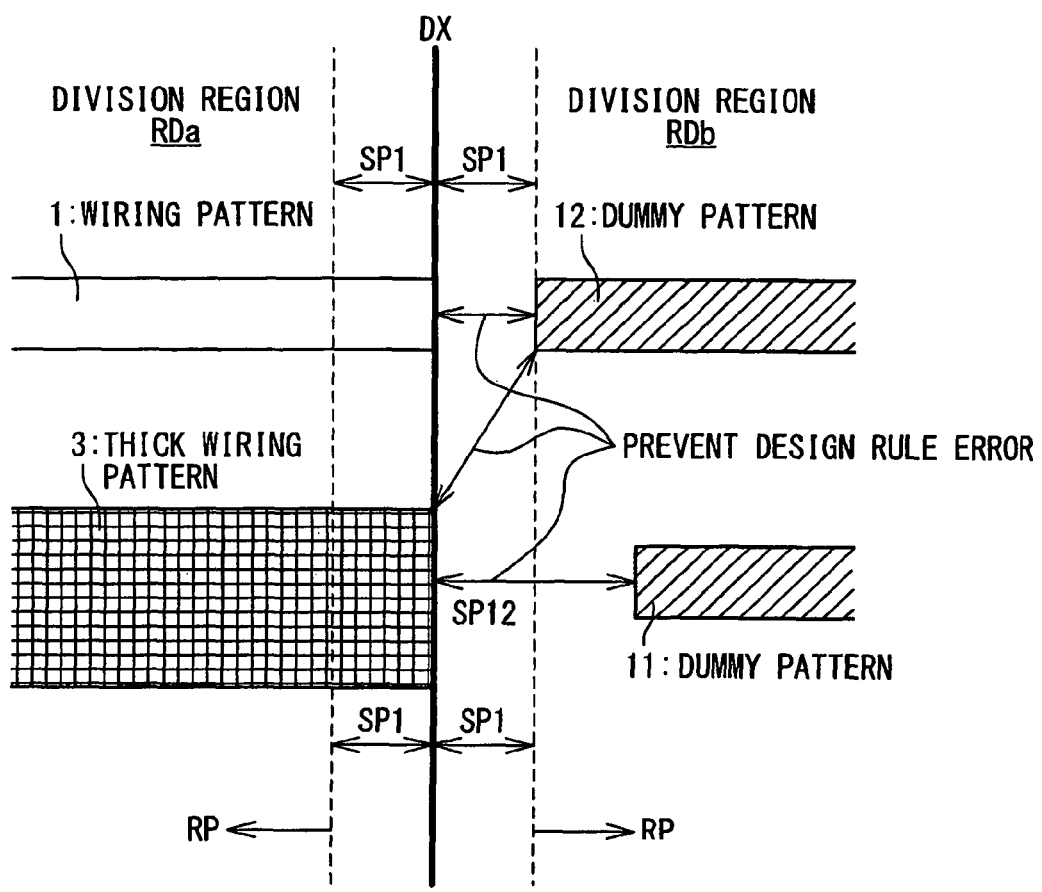
FIG. 5 is a conceptual diagram for explaining an effect of the embodiment of the present invention.

As an example, Let us consider a situation shown in FIG. 5 where division regions RDa and RDb are adjacent to each other across a division boundary DX. The division boundary DX is along the Y-direction and orthogonal to the wiring tracks. As a result of the setback processing, the dummy pattern placement region RP is apart from the division boundary DX by a predetermined distance SP1. The predetermined distance SP1 is, for example, equal to the above-described first wiring pitch specified by the design rule.

Step S130:

This step is the same as Step S13 disclosed in Japanese Patent Publication JP-2009-49341A. That is, the dummy pattern placement processing is performed with respect to the plurality of division regions RD in a parallel distributed manner. In the dummy pattern placement processing, a dummy pattern is additionally placed in the dummy pattern placement region RP of each of the division regions RD. At this time, the peripheral pattern is associated with the division region RD, and therefore the peripheral pattern existing around the division region RD also is taken into consideration. That is, the dummy pattern is added into the dummy pattern placement region RP such that not only a design rule error with the existing patterns in the division region RD is avoided but also a design rule error with the peripheral pattern 3 (thick wiring patter 3) near the division region RD is avoided. After the addition of the dummy pattern, the pattern density is checked.

Step S14:

This step is the same as Step S14 disclosed in Japanese Patent Publication JP-2009-49341A. That is, the plurality of division regions RD to which the dummy patterns are added are coupled with each other.

Step S20:

The same processing is carried out with respect to each layout layer. In this manner, a "dummy pattern-added layout data" that is the layout data to which the dummy patterns are added is completed.

(Effects)

According to the present embodiment, the layout region RL is divided into the plurality of division regions RD. Accordingly, the above-described dummy pattern placing and the pattern density checking can be carried out in a parallel distributed manner for the plurality of division regions RD. Due to the parallel distributed processing, the time required for the dummy pattern placing is greatly reduced. That is, the design TAT is considerably reduced.

Furthermore, even if the parallel distributed processing is performed, occurrence of a design rule error and short circuit around the division boundary can be suppressed.

For example, as shown in FIG. 5; the division regions RDa and RDb are adjacent to each other across the division boundary DX intersecting with the wiring tracks. As a result of the setback processing with respect to the division boundary DX, the dummy pattern placement region RP is apart from the division boundary DX by the first wiring pitch SP1. A dummy pattern 12 is placed in the dummy pattern placement region RP of the division region RDb. The dummy pattern 12 is apart from the division boundary DX by at least the first wiring pitch SP1. Accordingly, even if the wiring pattern 1 is placed in the division region RDa so as to reach the division boundary DX, no design rule error (spacing error) occurs between the wiring pattern 1 and the dummy pattern 12.

Moreover, in the example shown in FIG. 5, the thick wiring pattern 3 is placed in the division region RDa so as to reach the division boundary DX. According to the present embodiment, the thick wiring pattern 3 in the division region RDa is associated with the adjacent division region RDb. Therefore, when the dummy patterns are placed in the dummy pattern placement region RP of the division region RDb, the thick wiring pattern 3 near the division region RDb also is taken into consideration. As a result, as shown in FIG. 5, a dummy pattern 11 in the division region RDb is placed so as to be apart from the thick wiring pattern 3 by at least the second wiring pitch SP12. Accordingly, after the division regions RDa and RDb are coupled to each other, no design rule error (spacing error) occurs between the thick wiring pattern 3 and the dummy pattern 11.

As a comparative example, let us consider a case where the thick wiring pattern 3 near the division region RDb is not taken into consideration when the dummy pattern 11 is placed. In this case, the dummy pattern 11 is simply placed in the dummy pattern placement region RP, and may be placed at a location separated from the division boundary DX by the first wiring pitch SP1. That is, an interval between the thick wiring pattern 3 and the dummy pattern 11 may become the first wiring pitch SP1 less than the second wiring pitch SP12. In this case, a design rule error occurs between the thick wiring pattern 3 and the dummy pattern 11, after the division region RDa and the division region RDb are coupled to each other. According to the present embodiment, such a design rule error can be prevented.

As another comparative example, let us consider a case where the setback processing is performed by an amount of the second wiring pitch SP12 larger than the first wiring pitch SP1. That is, we consider a case where the dummy pattern placement region RP is separated from the division boundary DX by the second wiring pitch SP12. In this case, although no design rule error occurs around the division region RX, an interval between the wiring pattern 1 and the dummy pattern 12 becomes "excessive". This may cause a pattern density error near the division boundary DX. That is, the excessive setback processing causes a pattern density error near a division boundary. According to the present embodiment, the excessive setback processing is not performed and thus occurrence of the pattern density error is suppressed.

Figure 6:
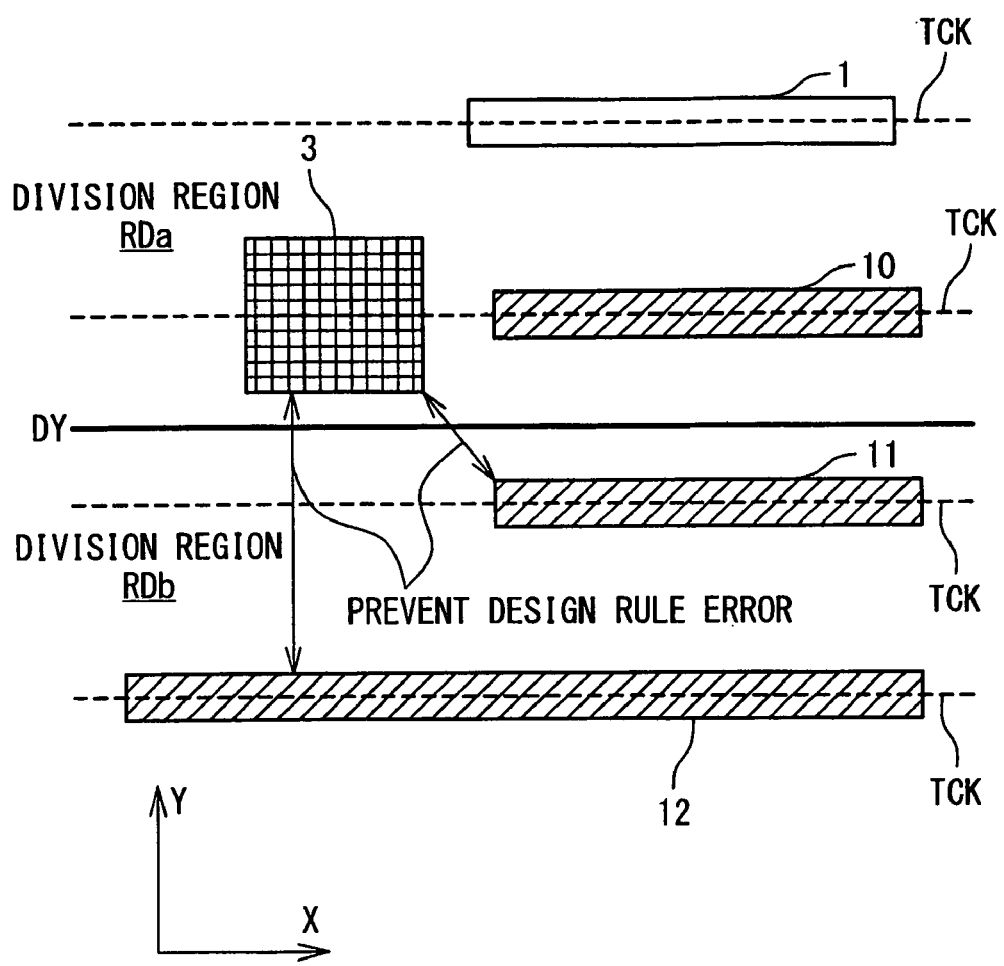
FIG. 6 is a conceptual diagram for explaining an effect of the embodiment of the present invention.

FIG. 6 illustrates another placement example. In FIG. 6, division regions RDa and RDb are adjacent to each other across a division boundary DY parallel to wiring tracks TCK. An interval between adjacent wiring tracks TCK is typically equal to the first wiring pitch. As described in Japanese Patent Publication JP-2009-49341A, the setback processing is not performed with respect to the division boundary DY parallel to the wiring tracks TCK. The reason is that a wiring pattern 1 and dummy patterns 10 to 12 are placed on the wiring tracks TCK defined by the design rule and hence no design rule error occurs around the division boundary DY in principle.

It should be noted that, as shown in FIG. 6, a thick wiring pattern 3 is placed near the division boundary DY in the division region RDa. If the thick wiring pattern 3 is not taken into consideration when the dummy pattern 11 is placed in the division region RDb, a design rule error between the thick wiring pattern 3 and the dummy pattern 11 may occur after the division region RDa and the division region RDb are coupled to each other. However, according to the present embodiment, the thick wiring pattern 3 in the division region RDa is associated with the adjacent division region RDb. Accordingly, when the dummy pattern 11 is placed in the division region RDb, the thick wiring pattern 3 also is taken into consideration. As a result, no design rule error occurs between the thick wiring pattern 3 and the dummy pattern 11, after the division region RDa and the division region RDb are coupled to each other.

Moreover, as a comparative example, let us consider a case where the setback processing is performed even with respect to the division boundary DY parallel to the wiring tracks TCK. In this case, a wiring track TCK near the division boundary DY goes out of the dummy pattern placement region RP, and therefore to add a dummy pattern onto the wiring track TCK becomes impossible. This means that a part of the wiring tracks TCK disappears, which may cause a pattern density error near the division boundary DY. On the other hand, in the present embodiment, the setback processing is performed with respect to not all division boundaries. What is subjected to the setback processing is only a division boundary intersecting with the wiring tracks TCK. Since unnecessary setback processing is not performed, occurrence probability of the pattern density error near a division boundary can be reduced.

As described above, according to the present embodiment, the design TAT can be reduced with suppressing occurrence of a design rule error and short circuit. Moreover, even if a special pattern 3 to which the design rule of the second wiring pitch SP12 is applied present near the outside of a division boundary, a design rule error around the division boundary can be prevented from occurring after the coupling of the division regions RD. Furthermore, since the excessive setback processing and unnecessary setback processing are not performed, occurrence of a pattern density error near a division boundary is suppressed.

2. Design System

The design method according to the present embodiment can be achieved by a computer system. In particular, the design method is preferably achieved by a computer system that is configured to execute parallel distributed processing. Such a distributed processing system can be appropriately constructed by a person skilled in the art.

Figure 7:
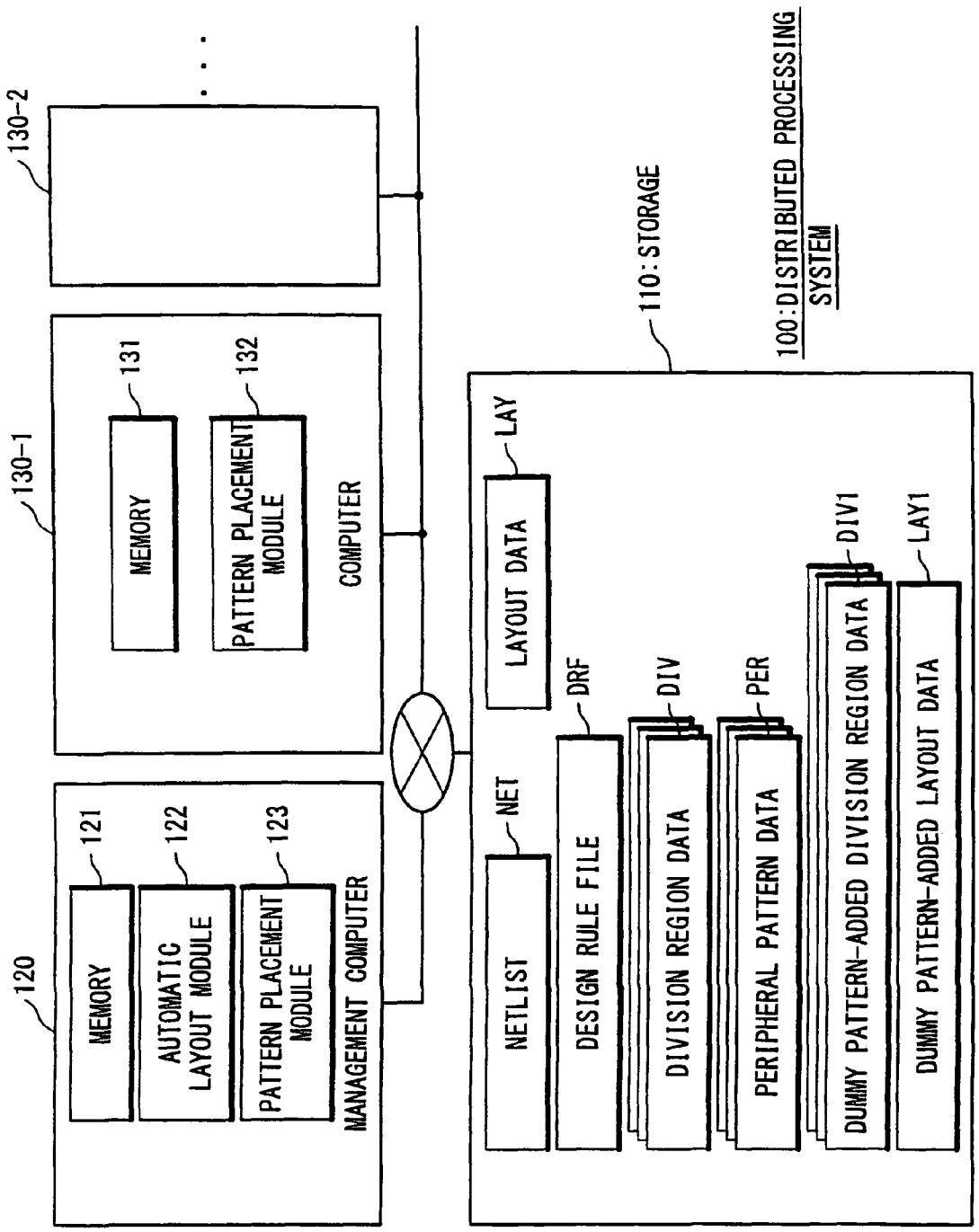
FIG. 7 is a block diagram showing a configuration example of a distributed processing system according to the embodiment of the present invention.

FIG. 7 shows an example of a configuration of a distributed processing system 100. The distributed processing system 100 has a storage 110, a management computer 120 and a plurality of computers 130. The storage 110, the management computer 120 and the plurality of computers 130 are connected to each other through a network. The storage 110 is exemplified by a hard disk. The management computer 120 and the computers 130 are exemplified by workstations.

Stored in the storage 110 are a netlist NET, a layout data LAY, a design rule file DRF, a division region data DIV, a peripheral pattern data PER, a dummy pattern-added division region data DIV1, a dummy pattern-added layout data LAY1 and the like.

The management computer 120 has a memory 121, an automatic layout module 122 and a pattern placement management module 123. The automatic layout module 122 is achieved by cooperation of an arithmetic processing unit and a software program, and provides a function of the above-described Step S1. The pattern placement management module 123 is achieved by cooperation of the arithmetic processing unit and a software program, and provides functions of the above-described Steps S110, S12 and S14.

Each of the computers 130 has a memory 131 and a pattern placement module 132. The pattern placement module 132 is achieved by cooperation of an arithmetic processing unit and a software program, and provides a function of the above-described Step S130.

First, the automatic layout module 122 reads the netlist NET and design rule file DRF of the design circuit from the storage 110. The netlist NET indicates a connection relationship in the design circuit, and the design rule file DRF indicates the design rule of the design circuit. Then, the automatic layout module 122 performs placement/routing processing on the basis of the netlist NET and the design rule file DRF to generate the layout data LAY. The layout data LAY indicates layout of the design circuit (see FIGS. 2 and 3). The automatic layout module 122 stores the generated layout data LAY in the storage 110.

Next, the pattern placement management module 123 reads the layout data LAY and the design rule file DRF from the storage 110. Then, based on the layout data LAY, the pattern placement management module 123 divides the layout region RL in which the wiring pattern 1 and the special pattern 3 are placed into the plurality of division regions RD (Step S111; see FIG. 3). As a result, a plurality of division region data DIV are generated respectively for the plurality of division regions RD. Each of the division region data DIV indicates layout of the corresponding division region RD.

Next, with respect to each division region RD, the pattern placement management module 123 extracts the special pattern 3 near the each division regions RD, as the peripheral pattern (Step S112; see FIG. 4). Data indicating physical information (shape and placement location) of the extracted peripheral pattern is the peripheral pattern data PER. The peripheral pattern data PER is generated for each of the division regions RD, and associated with the corresponding division region data DIV (Step S113). More specifically, the peripheral pattern data PER is added to the corresponding division region data DIV. At this time, a relative positional relationship between the division region RD and the peripheral pattern around the division region RD is maintained.

Furthermore, the pattern placement management module 123 refers to the design rule file DRF to determine the dummy pattern placement region RP with respect to each division region RD (Step S12; see FIG. 5). Then, the pattern placement management module 123 adds the determined dummy pattern placement region RP to the corresponding division region data DIV.

In this manner, the pattern placement management module 123 generates the plurality of division region data DIV which are respectively corresponding to the plurality of division regions RD. Each of the division region data DIV indicates the layout and dummy pattern placement region RP of the corresponding division region RD as well as the above-mentioned extracted peripheral pattern. The pattern placement management module 123 stores the plurality of generated division region data DIV in the storage 110.

Subsequently, the pattern placement management module 123 instructs the plurality of computers 130 to execute the dummy pattern placement processing (Step S130). The plurality of computers 130 executes the dummy pattern placement processing respectively for the plurality of division regions RD in a parallel distributed manner.

More specifically, the plurality of computers 130 respectively read the plurality of division region data DIV from the storage 110. Alternatively, the pattern placement management module 123 distributes the plurality of division region data DIV to the plurality of computers 130, respectively. Then, on the basis of the received division region data DIV, the pattern placement module 132 of each computer 130 adds the dummy pattern and checks the pattern density (Step S130). At this time, the pattern placement module 132 takes the peripheral pattern near the corresponding division region RD into consideration. Thus, the dummy pattern-added division region data DIV1 to which the dummy pattern is added is generated. The pattern placement module 132 stores the generated dummy pattern-added division region data DIV1 in the storage 110, or sends it back to the management computer 120.

The pattern placement management module 123 obtains the dummy pattern-added division region data DIV1 respectively corresponding to the plurality of division regions RD. Then, the pattern placement management module 123 couples the plurality of division regions RD to which the dummy pattern is added with each other (Step S14). In this manner, the dummy pattern-added layout data LAY1 is generated. The pattern placement management module 123 stores the generated dummy pattern-added layout data LAY1 in the storage 110.

In this manner, the processing according to the embodiment of the present invention can be achieved. The pattern placement management module 123 and pattern placement module 132 provide the function that adds the dummy patterns to the layout data LAY to generate the dummy pattern-added layout data LAY1.

As described above, the dummy pattern placement processing is executed in parallel by the plurality of computers 130. Accordingly, the design TAT is shortened. Moreover, since the division region data DIV is generated by dividing the layout data LAY, the amount of a single piece of division region data DIV processed by a single computer 130 becomes small. Therefore, a processing speed is increased as compared with a case of dummy pattern processing with respect to the entire chip. This also contributes to the reduction of the design TAT.

It is apparent that the present invention is not limited to the above embodiments and may be modified and changed without departing from the scope and spirit of the invention.

What is claimed is:

1. A method of designing a semiconductor integrated circuit, the method comprising:

dividing a layout region of the semiconductor integrated circuit in which a wiring pattern and a special pattern are placed into a plurality of division regions, wherein a minimum pitch specified for said wiring pattern by a design rule comprises a first wiring pitch, and a minimum pitch specified for said special pattern by said design rule comprises a second wiring pitch that is larger than said first wiring pitch;

extracting, as executed by a processing unit on a computer, with respect to each of said plurality of division regions, said special pattern included in a region that surrounds each said division region and has a predetermined width, wherein said extracted special pattern comprises a peripheral pattern;

determining, with respect to each said division region, a dummy pattern placement region included in each said division region, wherein said dummy pattern placement region is apart from at least one of boundaries between each said division region and adjacent division regions;

adding a dummy pattern in said dummy pattern placement region of each said division region, and avoiding a design rule error with said peripheral pattern existing around each said division region; and coupling said plurality of division regions to which said dummy pattern is added with each other.

2. The method according to claim 1, wherein said predetermined width is approximately equal to said second wiring pitch.

3. The method according to claim 2, wherein said second wiring pitch comprises a maximum wiring pitch that is specified by said design rule.

4. The method according to claim 1, wherein said special pattern includes a macro cell pattern or a thick wiring pattern whose width is thicker than that of said wiring pattern.

5. The method according to claim 1, wherein said wiring pattern and said dummy pattern are placed along a first direction, wherein said boundaries include a first boundary that intersects with said first direction, and wherein said dummy pattern placement region is apart from said first boundary by a predetermined distance.

6. The method according to claim 5, wherein said predetermined distance is approximately equal to said first wiring pitch.

7. The method according to claim 1, wherein said adding said dummy pattern is executed in parallel with respect to said plurality of division regions.

8. The method of designing a semiconductor integrated circuit according to claim 1, wherein the special pattern is separated from an associated one of the dummy patterns by at least a width of the second wiring pitch.

9. The method of designing a semiconductor integrated circuit according to claim 1, wherein the wiring pattern is separated from an associated one of the dummy patterns by at least a width of the first wiring pitch.

10. The method of designing a semiconductor integrated circuit according to claim 1, further comprising dividing the layout into a plurality of division boundaries comprising a first division boundary that separates a first and a second division region of the plurality of division regions.

11. The method of designing a semiconductor integrated circuit according to claim 10, wherein the first division region is offset from the first division boundary in a first direction by a width of the first wiring pitch, and the second division region is offset from the first division boundary in a second direction opposite from the first direction by a width of the first wiring pitch.

12. The method of designing a semiconductor integrated circuit according to claim 1, wherein the plurality of division regions comprises a first and a second division region, and when the special wiring pattern is placed outside of the first division region, a dummy pattern is placed in the second division region so as to be apart from the special pattern by a width of at least the second wiring pitch.

13. The method of designing a semiconductor integrated circuit according to claim 1, further comprising checking a density of the wiring pattern, while adding the dummy patterns to each of the dummy pattern placement regions.

14. The method of designing a semiconductor integrated circuit according to claim 1, wherein the special pattern comprises a thick wiring pattern that is larger than the wiring pattern.

15. A design system for a semiconductor integrated circuit, the design system comprising:
- a storage device in which a layout data indicating a wiring pattern and a special pattern is stored;
- a first computer; and
- a plurality of second computers,
- wherein a minimum pitch specified for said wiring pattern by a design rule comprises a first wiring pitch, and a minimum pitch specified for said special pattern by said design rule comprises a second wiring pitch that is larger than said first wiring pitch,
- wherein said first computer reads said layout data from said storage device and divides a layout region of the semiconductor integrated circuit in which said wiring pattern and said special pattern are placed into a plurality of division regions,
- wherein said first computer extracts, with respect to each of said plurality of division regions, said special pattern included in a region that surrounds each said division region and has a predetermined width, said extracted special pattern comprising a peripheral pattern,
- wherein said first computer determines, with respect to each said division region, a dummy pattern placement region included in each said division region, said dummy pattern placement region being apart from at least one of boundaries between each said division region and adjacent division regions,
- wherein said first computer generates, with respect to each said division region, a division region data indicating a layout of each said division region, said dummy pattern placement region and said peripheral pattern,
- wherein said plurality of second computers execute dummy pattern placement processing with respect to said plurality of division regions in a distributed manner,
- wherein, in said dummy pattern placement processing, each of said plurality of second computers receives said division region data of the corresponding division region, adds a dummy pattern in said dummy pattern placement region, and avoids a design rule error with said peripheral pattern, and
- wherein said first computer receives said plurality of division region data to which said dummy pattern is added and couples said plurality of division regions with each other.

16. A method of designing a semiconductor integrated circuit, the method comprising:
- dividing a layout region of the semiconductor integrated circuit into a plurality of division regions;
- placing a wiring pattern and a special pattern into the plurality of division regions;
- extracting, as executed by a processing unit on a computer, a peripheral pattern for each division region of the plurality of division regions, the peripheral pattern comprising a portion of the special pattern that is included around each division region;
- associating each of the peripheral patterns with a respective one of the division regions;
- determining a dummy pattern placement region for each division region; and
- placing a dummy pattern in each of the dummy pattern placement regions, while checking a density of the wiring pattern,
- wherein the wiring pattern comprises a first wiring pitch, and the special pattern comprises a second wiring pitch that is larger than the first wiring pitch.

17. The method according to claim 16, wherein the peripheral patterns prevents a design error rule from occurring when the dummy pattern is placed in each of the dummy pattern placement regions.

18. The method according to claim 16, wherein each of the peripheral patterns comprises a predetermined width.

19. The method according to claim 16, wherein each of the predetermined widths are approximately equal to the second wiring pitch.

20. The method according to claim 16, further comprising coupling the plurality of division regions to comprising the dummy patterns to each other.

* * * * *